(12) United States Patent
Venezia et al.

(10) Patent No.: US 7,901,974 B2
(45) Date of Patent: Mar. 8, 2011

(54) MASKED LASER ANNEAL DURING FABRICATION OF BACKSIDE ILLUMINATED IMAGE SENSORS

(75) Inventors: Vincent Venezia, Sunnyvale, CA (US); Hsin-Chih Tai, Cupertino, CA (US); Duli Mao, Sunnyvale, CA (US); Yin Qian, Milpitas, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 301 days.

(21) Appl. No.: 12/178,552

(22) Filed: Jul. 23, 2008

(65) Prior Publication Data
US 2009/0200587 A1    Aug. 13, 2009

Related U.S. Application Data

(60) Provisional application No. 61/027,362, filed on Feb. 8, 2008.

(51) Int. Cl.
*H01L 21/00*    (2006.01)

(52) U.S. Cl. ............. 438/73; 257/292; 438/75; 438/799; 438/949

(58) Field of Classification Search .............. 438/75
See application file for complete search history.

(56) References Cited

U.S. PATENT DOCUMENTS

| | | | |
|---|---|---|---|
| 5,688,715 A * | 11/1997 | Sexton et al. | 438/75 |
| 5,911,106 A | 6/1999 | Tasaka | |
| 6,019,796 A * | 2/2000 | Mei et al. | 438/151 |
| 6,124,179 A * | 9/2000 | Adamic, Jr. | 438/309 |
| 2001/0044175 A1 * | 11/2001 | Barrett et al. | 438/224 |
| 2006/0006488 A1 | 1/2006 | Kanbe | |
| 2007/0207566 A1 * | 9/2007 | Fu et al. | 438/64 |

FOREIGN PATENT DOCUMENTS

WO    WO/94/14188    6/1994

OTHER PUBLICATIONS

Sameshima, T. et al., "Improvement of SiO2 Properties and Silicon Surface Passivation by Heat Treatment with High-Pressure H2O Vapor", Japan Journal of Applied Physics, vol. 37, Part 2, No. 12A, Dec. 1, 1998, pp. L1452-L1454, Japan Journal of Applied Physics Publication Board, Japan.

Takato, H. et al., "Surface Passivation Effect of Silicon Substrates due to Quinhydrone/Ethanol Treatment", Japan Journal of Applied Physics, vol. 40, Part 2, No. 10A, Oct. 1, 2001, pp. L1003-L1004, The Japan Society of Applied Physics, Japan.

(Continued)

*Primary Examiner* — N Drew Richards
*Assistant Examiner* — Robert Carpenter
(74) *Attorney, Agent, or Firm* — Blakely Sokoloff Taylor & Zafman LLP

(57) ABSTRACT

A technique for fabricating an array of imaging pixels includes fabricating front side components on a front side of the array. After fabricating the front side components, a dopant layer is implanted on a backside of the array. A mask is formed over the dopant layer to selectively expose portions of the dopant layer. Next, the exposed portions of the dopant layer are laser annealed. Alternatively, the mask may be disposed over the backside prior to the formation of the dopant layer and the dopants implanted through the exposed portions and subsequently laser annealed.

8 Claims, 8 Drawing Sheets

OTHER PUBLICATIONS

Schmidt, J. et al., "Surface passivation of silicon solar cells using plasma-enhanced chemical-vapor-deposited SiN films and thin thermal SiO2/plasma SiN stacks", Semiconductor Science and Technology, vol. 16, 2001, pp. 164-170, Institute of Physics Publishing, United Kingdom.

Kurita, K. et al., "Low Surface Recombination Velocity on Silicon Water Surfaces due to Iodine-Ethanol Treatment", Japanese Journal of Applied Physics, vol. 38, Part 1, No. 10, Oct. 1999, pp. 5710-5714, Japan Journal of Applied Physics Publication Board, Japan.

* cited by examiner

MASKED LASER ANNEAL DURING FABRICATION OF BACKSIDE ILLUMINATED IMAGE SENSORS

CROSS REFERENCE TO RELATED APPLICATION

This application claims the benefit of U.S. Provisional Application No. 61/027,362, filed on Feb. 8, 2008, the contents of which are incorporated herein by reference.

TECHNICAL FIELD

This disclosure relates generally to imaging sensors, and in particular but not exclusively, relates to backside illuminated CMOS imaging sensors.

BACKGROUND INFORMATION

FIG. 1 illustrates a backside illuminated ("BSI") image sensor 100 including a photodiode ("PD") region 105 disposed within a silicon P-epitaxial ("epi") layer 110. Pixel circuitry for operation of the BSI image sensor is formed over a P well 115. Only the transfer transistor and the reset transistor of the pixel circuitry are illustrated. A first metal layer M1 for coupling to the gates of the transfer and reset transistors is disposed within an inter-metal dielectric layer 120.

BSI image sensor 100 is photosensitive to light incident upon the backside of the sensor die. For BSI image sensors, the majority of photon absorption occurs near the backside silicon surface. To separate the electron-hole pairs created by photon absorption and drive the electrons to PD region 105, an electric field near the back silicon surface is helpful. This electric field may be created by doping the back surface and laser annealing. Laser annealing is an annealing process which creates localized heating.

For a thick P-epi layer 110, the laser pulse raises the back surface temperature greatly (e.g., in excess of 1000 C), but due to the short pulse, the temperature reduces quickly in the bulk of the silicon. However, when the silicon is thin (e.g., P-epi layer 110<4 um thick), the insulation from inter-metal dielectric layer 120 and the remainder of the back-end-of-the-line ("BEOL") may cause a significant increase in substrate temperature that can result in deleterious effects, such as dopant diffusion at temperatures greater than 800 C and/or BEOL metal deterioration/melting at temperatures greater than 400 C.

This problem may be solved by using a thicker final silicon layer 110, which can be produced by removing only a portion of the bulk substrate during the backside thinning process. Retaining a thick layer of silicon between the backside and the front side places the high temperature back surface further away from the dopant profiles and metal/silicide contacts on the front side. However, increasing this thickness results in increased electrical crosstalk between adjacent pixels in an imaging sensor array. Therefore, the trend has been to make P-epi layer 110 thinner (e.g., on the order of 1.5 to 3.0 um).

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of a system and method for fabricating a backside illuminated ("BSI") imaging sensor are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
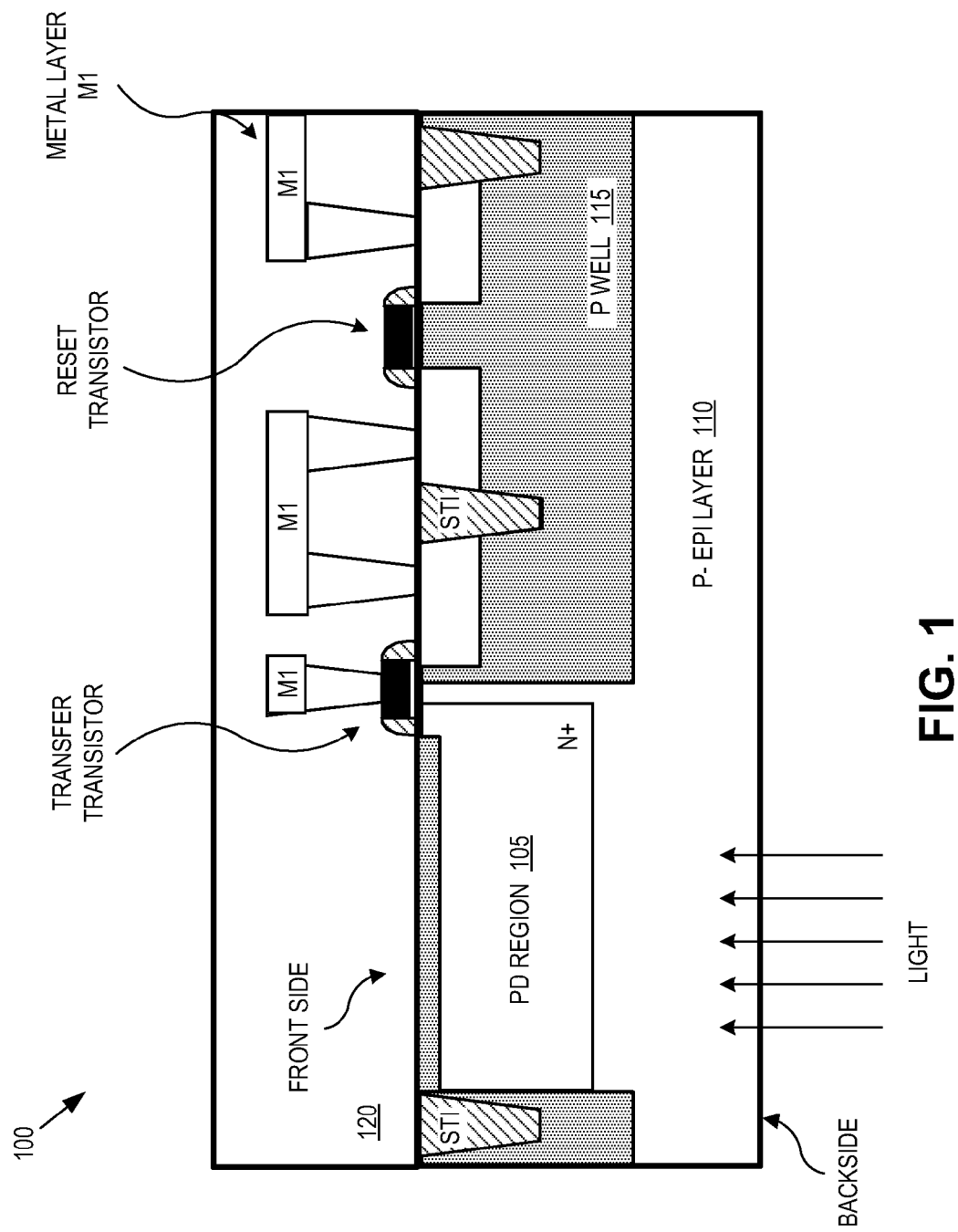
FIG. 1 is a cross sectional view of a backside illuminated image sensor.
Figure 2:
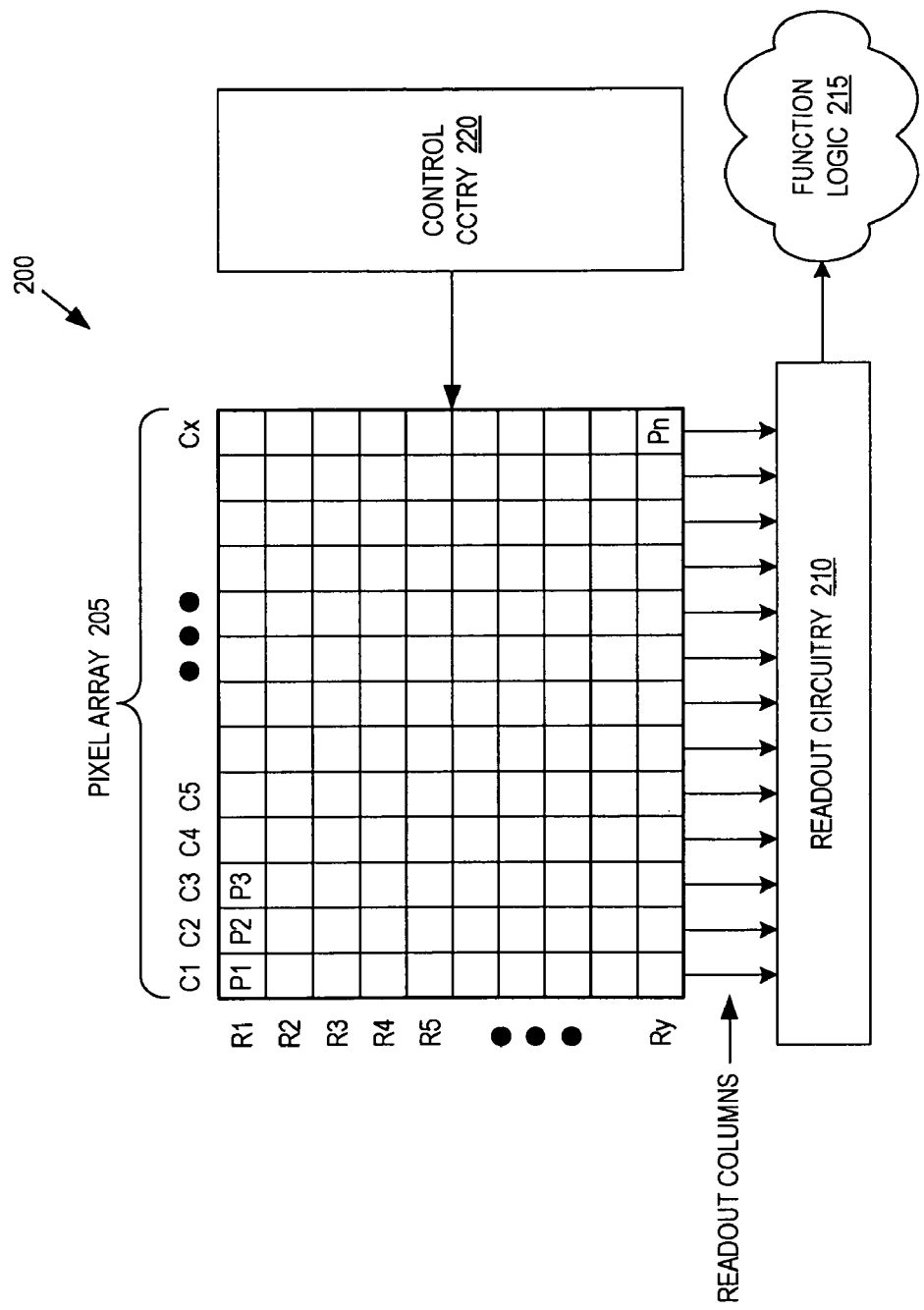
FIG. 2 is a block diagram illustrating a backside illuminated imaging system, in accordance with an embodiment of the invention.

FIG. 2 is a block diagram illustrating a BSI imaging system 200, in accordance with an embodiment of the invention. The illustrated embodiment of imaging system 200 includes a pixel array 205, readout circuitry 210, function logic 215, and control circuitry 220.

Pixel array 205 is a two-dimensional ("2D") array of backside illuminated imaging sensors or pixels (e.g., pixels P1, P2 . . . , Pn). In one embodiment, each pixel is a complementary metal-oxide-semiconductor ("CMOS") imaging pixel. As illustrated, each pixel is arranged into a row (e.g., rows R1 to Ry) and a column (e.g., column C1 to Cx) to acquire image data of a person, place, or object, which can then be used to render a 2D image of the person, place, or object.

After each pixel has acquired its image data or image charge, the image data is readout by readout circuitry 210 and transferred to function logic 215. Readout circuitry 210 may include amplification circuitry, analog-to-digital ("ADC") conversion circuitry, or otherwise. Function logic 215 may simply store the image data or even manipulate the image data by applying post image effects (e.g., crop, rotate, remove red eye, adjust brightness, adjust contrast, or otherwise). In one embodiment, readout circuitry 210 may readout a row of image data at a time along readout column lines (illustrated) or may readout the image data using a variety of other techniques (not illustrated), such as a serial readout or a full parallel readout of all pixels simultaneously.

Control circuitry 220 is coupled to pixel array 205 to control operational characteristic of pixel array 205. For example, control circuitry 220 may generate a shutter signal for controlling image acquisition. In one embodiment, the shutter signal is a global shutter signal for simultaneously enabling all pixels within pixel array 205 to simultaneously capture their respective image data during a single acquisition window. In an alternative embodiment, the shutter signal is a rolling shutter signal whereby each row, column, or group of pixels is sequentially enabled during consecutive acquisition windows.

Figure 3:
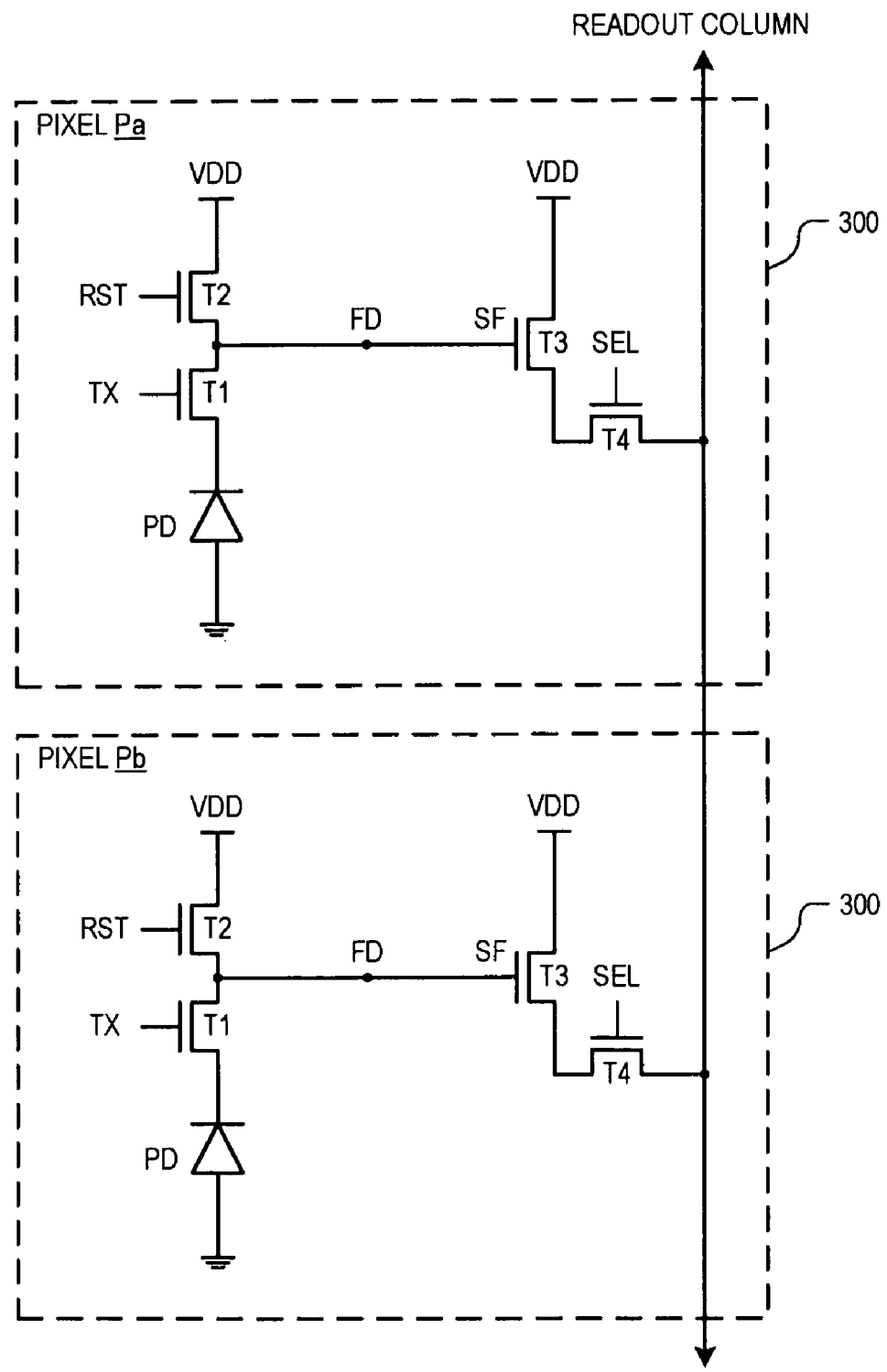
FIG. 3 is a circuit diagram illustrating pixel circuitry of two 4T pixels within a backside illuminated imaging system, in accordance with an embodiment of the invention.

FIG. 3 is a circuit diagram illustrating pixel circuitry 300 of two four-transistor ("4T") pixels within a BSI imaging array, in accordance with an embodiment of the invention. Pixel circuitry 300 is one possible pixel circuitry architecture for implementing each pixel within pixel array 200 of FIG. 2. However, it should be appreciated that embodiments of the present invention are not limited to 4T pixel architectures; rather, one of ordinary skill in the art having the benefit of the instant disclosure will understand that the present teachings are also applicable to 3T designs, 5T designs, and various other pixel architectures.

In FIG. 3, pixels Pa and Pb are arranged in two rows and one column. The illustrated embodiment of each pixel circuitry 300 includes a photodiode PD, a transfer transistor T1, a reset transistor T2, a source-follower ("SF") transistor T3, a select transistor T4, and a storage capacitor C1. During operation, transfer transistor T1 receives a transfer signal TX, which transfers the charge accumulated in photodiode PD to a floating diffusion node FD. In one embodiment, floating diffusion node FD may be coupled to a storage capacitor for temporarily storing image charges.

Reset transistor T2 is coupled between a power rail VDD and the floating diffusion node FD to reset (e.g., discharge or charge the FD to a preset voltage) under control of a reset signal RST. The floating diffusion node FD is coupled to control the gate of SF transistor T3. SF transistor T3 is coupled between the power rail VDD and select transistor T4. SF transistor T3 operates as a source-follower providing a high impedance output from the pixel. Finally, select transistor T4 selectively couples the output of pixel circuitry 300 to the readout column line under control of a select signal SEL. In one embodiment, the TX signal, the RST signal, and the SEL signal are generated by control circuitry 220.

Figure 4:
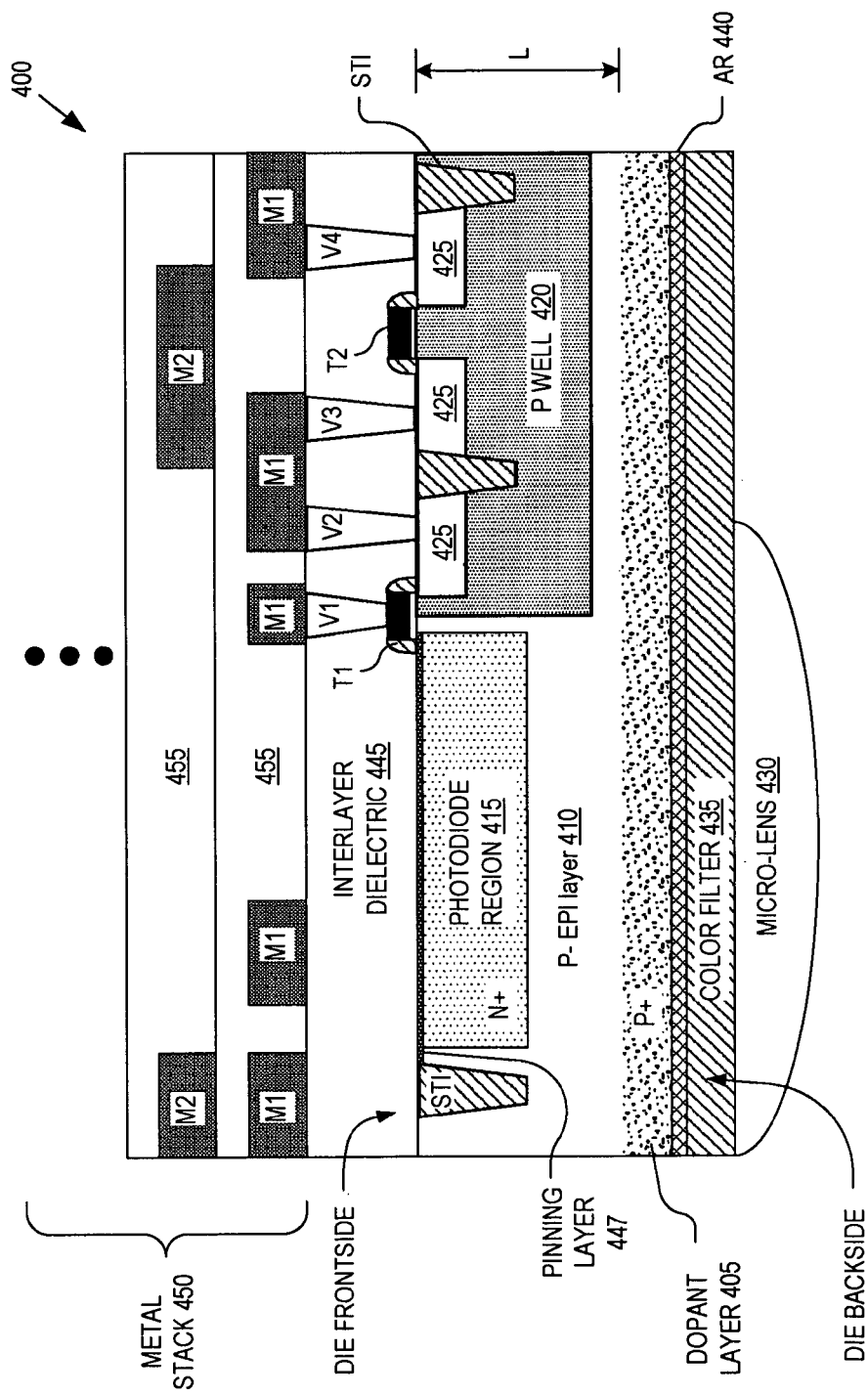
FIG. 4 is a cross sectional view of backside illuminated image sensor having a backside dopant layer, in accordance with an embodiment of the invention.

FIG. 4 is a cross sectional view of BSI imaging pixel 400 having a laser annealed dopant layer 405 disposed on its backside, in accordance with an embodiment of the invention. Imaging pixel 400 is one possible implementation of pixels P1 to Pn within pixel array 205. The illustrated embodiment of imaging pixel 400 includes P+dopant layer 405, a P−epitaxial ("epi") layer 410, a photodiode region 415, a P well 420, N+source/drain diffusions 425, pixel circuitry (only transfer transistor T1 and reset transistor T2 are illustrated), a microlens 430, a color filter layer 435, an antireflective ("AR") film 440, an inter-metal dielectric layer 445, a P+passivation or pinning layer 447, and a metal stack 450. The illustrated embodiment of metal stack 450 includes multiple metal layers (e.g., M1, M2, etc.) separated by inter-metal dielectrics 455, and interconnected with vias (e.g., V1, V2, V3, etc.). Although FIG. 4 illustrates only a two layer metal stack, metal stack 450 may include more or less layers for routing signals over the front side of pixel array 205. Finally, shallow trench isolations ("STI") isolate internal components of imaging pixel 400 and isolate imaging pixel 400 from adjacent pixels (not illustrated).

Figure 5:
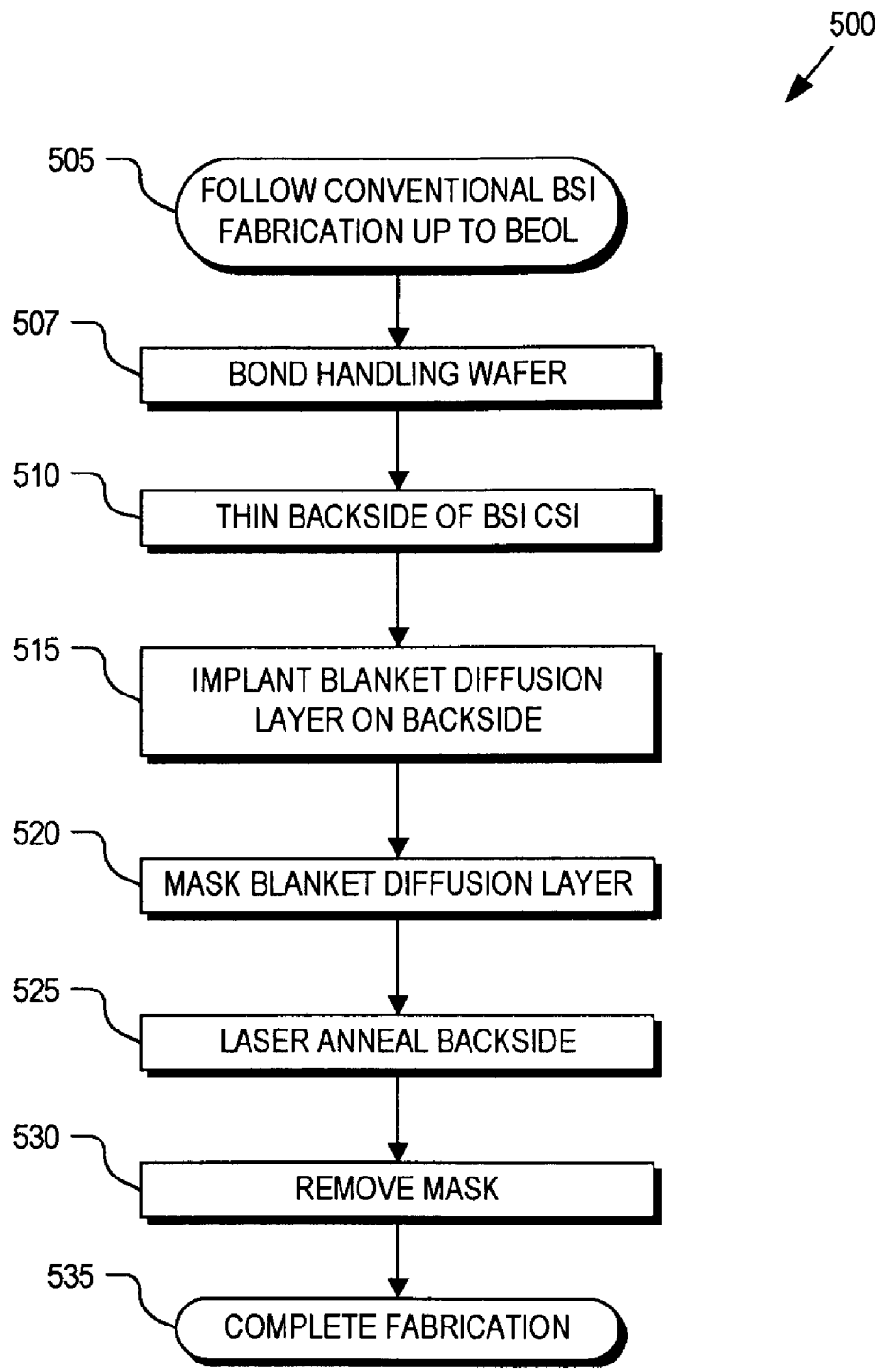
FIG. 5 is a flow chart illustrating a process for fabricating a backside illuminated imaging sensor by applying a blanket dopant layer and using a laser anneal mask, in accordance with an embodiment of the invention.

FIG. 5 is a flow chart illustrating a process 500 for fabricating a BSI imaging pixel 400, in accordance with an embodiment of the invention. Process 500 is described with reference to FIGS. 6A-6D. The order in which some or all of the process blocks appear in process 500 should not be deemed limiting. Rather, one of ordinary skill in the art having the benefit of the present disclosure will understand that some of the process blocks may be executed in a variety of orders not illustrated.

Figure 6A:
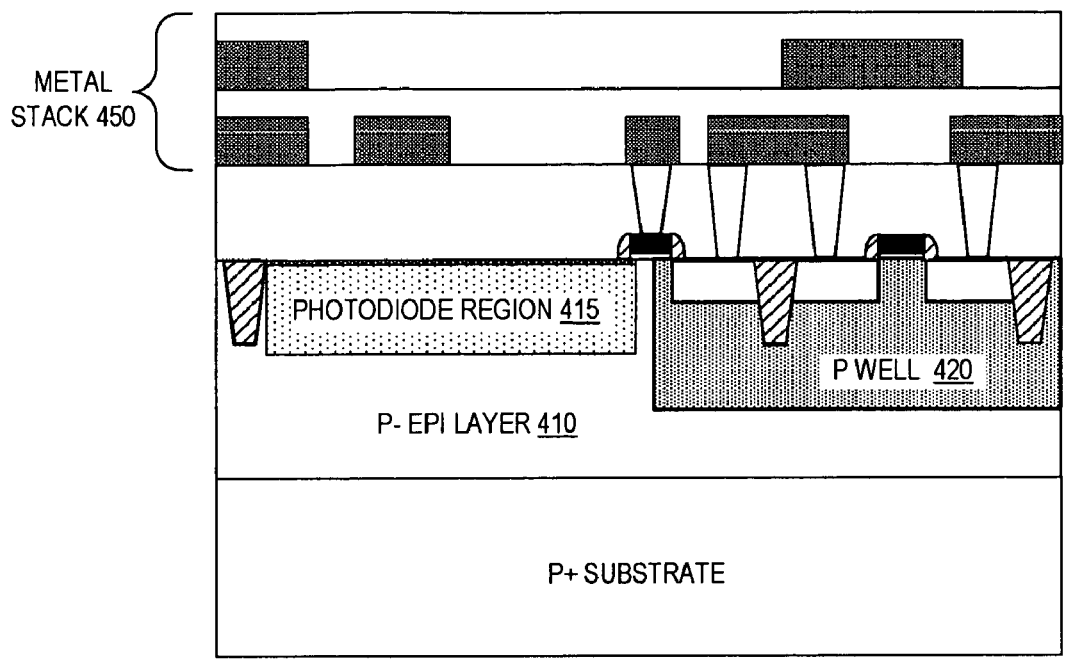
FIG. 6A is a cross sectional view of a partially fabricated backside illuminated imaging sensor fabricated up to completion of the BEOL, in accordance with an embodiment of the invention.
Figure 6B:
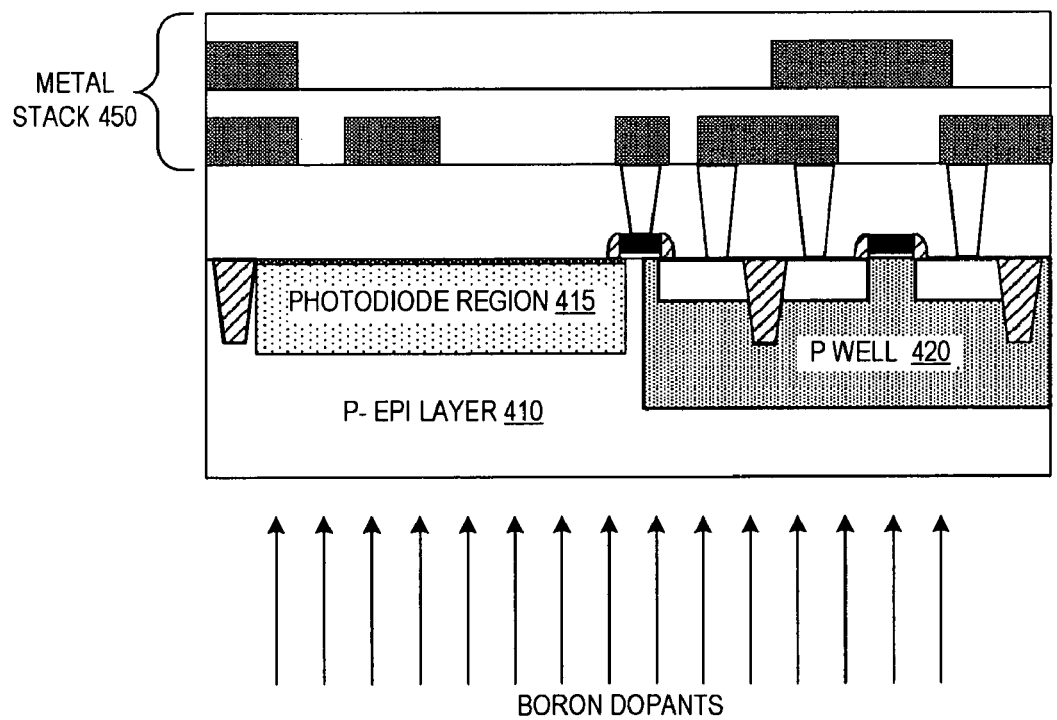
FIG. 6B is a cross sectional view of a partially fabricated backside illuminated imaging sensor illustrating a dopant layer implant on the backside, in accordance with an embodiment of the invention.
Figure 6C:
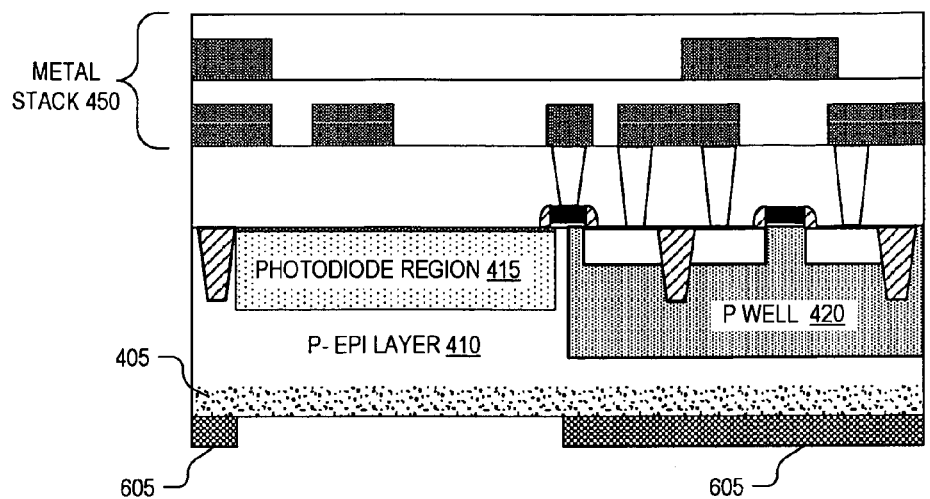
FIG. 6C is a cross sectional view of a partially fabricated backside illuminated imaging sensor illustrating formation of a laser anneal mask on the backside, in accordance with an embodiment of the invention.
Figure 6D:
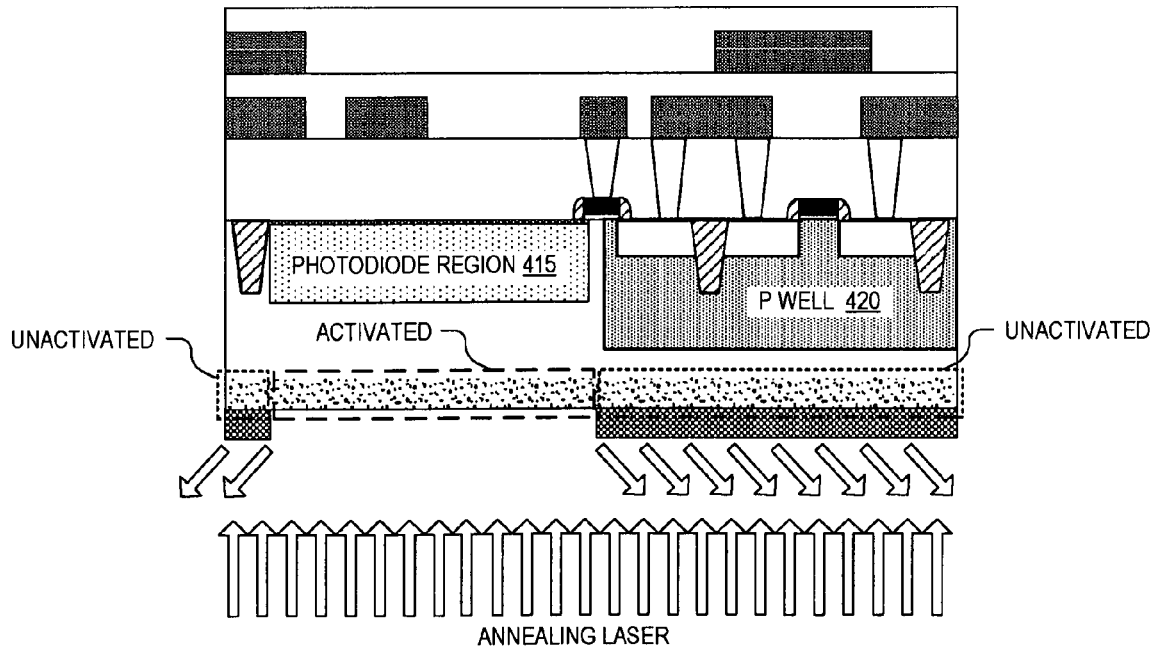
FIG. 6D is a cross sectional view of a partially fabricated backside illuminated imaging sensor illustrating a laser anneal process, in accordance with an embodiment of the invention.

In a process block 505, fabrication of imaging pixel 400 follows conventional techniques right up to fabrication of the back-end-of-the-line ("BEOL") components including diffusion implants, silicides, pixel transistor circuitry, and metal stack 450 (see FIG. 6A). In a process block 507, a handle wafer is bonded to the imaging pixel. In a process block 510, imaging pixel 400 is backside thinned to remove the P+substrate and expose P−epi layer 410. Backside thinning may be performed with a combination of chemical mechanical polishing ("CMP") and chemical etching. In a process block 515, dopant layer 405 is implanted into the backside of imaging pixel 400 as a blanket P+dopant layer (see FIG. 6B). In one embodiment, boron is implanted into the backside surface using established ion implantation techniques. Dopant layer 405 creates a dopant gradient which provides a vertical force for pushing photo-generated electrons vertically towards to the collecting depletion region of the photodiode. Additionally, dopant layer 405 passivates the backside surface of P−epi layer 410 and thereby prevents leakage current from N+photodiode region 415.

In standard BSI fabrication processes using backside implants, a dopant implant is usually followed by a laser anneal. During a laser anneal, the temperature of the annealed surface can rise well above 1000 C, depending on the laser power, penetration depth, and pulse time. However, the temperature is expected to drop within the semiconductor material (e.g., silicon) due to heat diffusion into the bulk. A BSI structure is basically a semiconductor-on-insulator ("SOI") device, since the silicon active region is isolated from a larger bulk silicon substrate by the BEOL dielectric layers. When the silicon active region is thick (L>4 um), the distance between the back surface and front surface is large enough so that the front surface temperature is significantly lower than the back surface temperature. For example, if the back surface temperature rises to >1000 C, the front surface temperature should still be below 400 C. However, thick silicon increases electrical crosstalk between adjacent pixels. Photo-electrons created near the back surface experience a vertical force towards the front surface due to the back surface P+doping (i.e., dopant layer 405). In addition to vertical motion created, the electrons move laterally due to diffusion (random motion). The further an electron has to travel to the photodiode collection region, the higher the probability that it diffuses into a neighboring pixel, a phenomena know as electrical crosstalk. Accordingly, the trend in BSI technology is therefore towards thinner silicon thickness (L<4 um) to reduce electrical crosstalk.

Reducing the silicon thickness introduces process complexities in terms of laser annealing the backside dopant layer 405. As described above, the temperature rise at the front surface will be greater for thin silicon. Accordingly, in a process block 520, a laser anneal mask 605 is deposited on the die or wafer backside (see FIG. 6C). In a process block 525, only the region below the photodiode region 415 is exposed when the annealing laser is scanned across the die or wafer backside (see FIG. 6D). Only the uncovered portion of dopant layer 405 is exposed to the laser, so only the boron in this exposed area is activated. The thickness and composition of mask 605 are laser and process dependent; however, the composition and thickness should be chosen to have a high reflectively to the laser wavelength. Mask 605 can be blanket deposited, masked, and etched by standard techniques. Finally, mask 605 is removed (process block 530) and fabrication of imaging pixel 400 completed with the addition of AR film 440, color filter 435, and microlens 430 (process block 535).

Masking the die backside prior to the laser anneal of dopant layer 405 provides a number of advantages. The amount of energy absorbed by the silicon is reduced, thereby reducing the temperature rise of the die. There are typically no metal/silicide contacts above photodiode region 415 and therefore the front surface can tolerate a larger temperature rise than regions with metal contacts. Metal contacts will typically degrade above 400 C, but dopant profiles typically do not diffuse below 800 C. The periphery circuit around photodiode region 415 and pixel array 205 is protected from the harmful effects of the laser anneal process. The P+type ion implant under the masked back surface area is not exposed and therefore is not activated creating a high recombination region. Electrons that migrate to or are formed in this region will recombine easily reducing crosstalk.

In an alternative embodiment, the entire pixel array 205 could be exposed during the masking process. This approach requires less stringent lithography overlay control while still protecting periphery circuits from the laser anneal.

Figure 7:
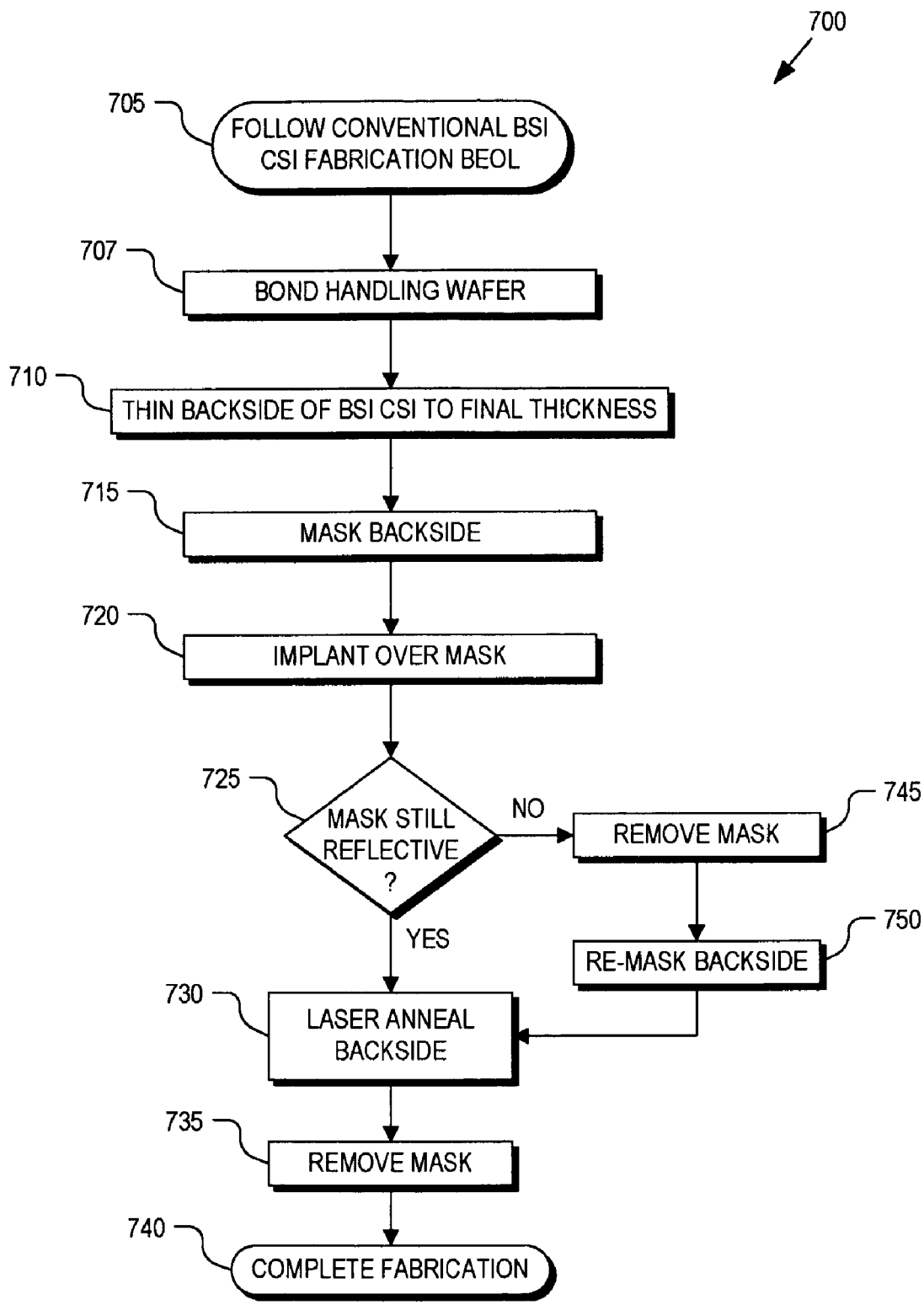
FIG. 7 is a flow chart illustrating a process for fabricating a backside illuminated imaging sensor using dopant and laser anneal mask(s), in accordance with an embodiment of the invention.

FIG. 7 is a flow chart illustrating a process 700 for fabricating a BSI imaging pixel 400 using dopant and laser anneal mask(s), in accordance with an embodiment of the invention. Process 700 illustrates an alternative fabrication technique to process 500. The order in which some or all of the process blocks appear in process 700 should not be deemed limiting. Rather, one of ordinary skill in the art having the benefit of the present disclosure will understand that some of the process blocks may be executed in a variety of orders not illustrated.

In a process block 705, fabrication of imaging pixel 400 follows conventional techniques right up to fabrication of the BEOL components similar to process 500. In a process block 707, a handle wafer is bonded to the imaging pixel 400. In a process block 710, imaging pixel 400 is backside thinned to remove the P+substrate and expose P–epi layer 410. In a process block 715, a dopant mask, which in some embodiments is also reflective to the annealing laser, is deposited on the die backside prior to implanting dopant layer 405. In a process block 720, dopant layer 405 is implanted over the dopant mask into the backside of imaging pixel 400. The dopant mask shields the die backside so that only exposed regions of the die backside are implanted with dopant layer 405. In one embodiment, only the area under each photodiode region 415 is exposed by the dopant mask. In an alternative embodiment, the entire pixel array 205 is exposed while periphery circuitry is covered.

If the dopant mask is still reflective to the annealing laser after implantation of dopants, such as boron, (decision block 725), then process 700 continues to a process block 730. Once annealed, the die backside is laser annealed using the same mask (process block 730), the dopant mask removed (process block 735), and fabrication completed as described above (process block 740).

However, if the dopant mask is no longer sufficiently reflective after the dopant implantation in process block 720, then process 700 continues to a process block 745. In process block 745, the dopant mask is removed and the die backside re-masked with a laser anneal mask, in a process block 750. Finally, the die backside is laser annealed (process block 730), the laser anneal mask removed (process block 735), and the final fabrication processes completed (process block 740).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A method of fabricating an array of complementary metal-oxide-semiconductor ("CMOS") imaging pixels, comprising:
    fabricating front side components on a front side of the array;
    implanting a blanket dopant layer across a backside of the array;
    masking the blanket dopant layer with a mask to selectively expose portions of the blanket dopant layer beneath a photodiode region of each CMOS imaging pixel within the array while covering pixel circuitry of each CMOS imaging pixel within the array; and
    laser annealing the exposed portions of the blanket dopant layer to create an activated portion of the blanket dopant layer beneath the photodiode region of each CMOS imaging pixel within the array while retaining an unactivated portion of the blanket dopant layer beneath the pixel circuitry of each CMOS imaging pixel within the array such that the activated portion and unactivated portion of each CMOS imaging pixel form a pattern of activated and unactivated portions across the backside of the array wherein the activated portions encourage photo-generated charge carriers to migrate towards the photodiode regions while the unactivated portions become high recombination regions for the photo-generated charge carriers that migrate laterally to reduce crosstalk between the CMOS imaging pixels.

2. The method of claim 1, wherein the mask covers and protects pixel circuitry of each of the imaging pixels from the laser annealing.

3. The method of claim 1, wherein the mask further protects peripheral logic surrounding the array of CMOS imaging pixels.

4. The method of claim 1, wherein the mask is reflective to a laser used during the laser annealing.

5. The method of claim 1, wherein fabricating the front side components comprises:
   forming an epitaxial layer over a semiconductor substrate;
   forming photodiode regions and associated pixel circuitry on or within a front side of the epitaxial layer;
   forming a metal stack over the front side of the epitaxial layer; and
   removing the semiconductor substrate from a backside of the epitaxial layer.

6. The method of claim 5, further comprising thinning the backside of the epitaxial layer until the epitaxial layer is less than or equal to 4 μm thick.

7. The method of claim 5, wherein the epitaxial layer comprises a P− doped layer and the dopant layer comprises a P+ doped layer having a higher concentration of dopants than the P− doped layer.

8. The method of claim 1, wherein the array of CMOS imaging pixels comprises an array of backside illuminated imaging pixels.

* * * * *